United States Patent
Watanabe

(10) Patent No.: US 6,492,759 B1
(45) Date of Patent: Dec. 10, 2002

(54) PIEZOELECTRIC RESONATOR AND A FILTER

(75) Inventor: Jun Watanabe, Kanagawa (JP)

(73) Assignee: Toyo Communication Equipment Co., Ltd., Kanagawa (JP)

( * ) Notice: Subject to any disclaimer, the term of this patent is extended or adjusted under 35 U.S.C. 154(b) by 16 days.

(21) Appl. No.: 09/665,476

(22) Filed: Sep. 20, 2000

(30) Foreign Application Priority Data

May 24, 2000 (JP) ........................................ 2000-152239

(51) Int. Cl.[7] .............................................. H02L 41/04
(52) U.S. Cl. ........................................ 310/320; 310/366
(58) Field of Search ................................ 310/320, 365, 310/366, 324, 330

(56) References Cited

U.S. PATENT DOCUMENTS

| | | | | |
|---|---|---|---|---|
| 5,235,240 A | * | 8/1993 | Morita et al. ................ | 310/344 |
| 5,495,135 A | * | 2/1996 | Zimnicki et al. ............. | 310/312 |
| 5,519,279 A | * | 5/1996 | Zimnicki ..................... | 310/363 |
| 6,133,673 A | * | 10/2000 | Kawara et al. .............. | 310/320 |
| 6,232,699 B1 | * | 5/2001 | Wajima ....................... | 310/320 |
| 6,274,964 B1 | * | 8/2001 | Yoshida et al. .............. | 310/321 |
| 6,333,591 B1 | * | 12/2001 | Yoshio et al. ................ | 310/365 |

FOREIGN PATENT DOCUMENTS

| | | | | |
|---|---|---|---|---|
| JP | 09199980 A | * | 7/1997 | ............ H03H/9/19 |
| JP | 10200373 A | * | 7/1998 | ............ H03H/9/56 |
| JP | 11004138 A | * | 1/1999 | ............ H03H/9/56 |
| JP | 2001244778 A | * | 9/2001 | ............ H03H/9/19 |

* cited by examiner

Primary Examiner—Thomas M. Dougherty
Assistant Examiner—Peter Medley
(74) Attorney, Agent, or Firm—Koda & Androlia

(57) ABSTRACT

A piezoelectric resonator has a piezoelectric substrate on obverse and reverse surfaces of which electrodes are disposed. Comb-shaped electrodes consisting of electrode fingers and spaces are disposed around the electrode situated at least on one surface of the piezoelectric substrate and at prescribed space intervals between this electrode and each of those comb-shaped electrodes. This arrangement enables obtaining means for suppressing the occurrence of spurious waves due to an inharmonic mode in the 200-MHz band high-frequency resonator or two-pole monolithic filter.

8 Claims, 7 Drawing Sheets

(a)

(b)

(c)

(d)

(a)

(b)

(a)

(b)

(c)

ENERGY TRAPPING COEFFICIENT $$P = (\pi/\sqrt{2})\mu L/H\sqrt{\Delta}$$

(d)

Freq.

(a)

(b)

(c)

PIEZOELECTRIC RESONATOR AND A FILTER

BACKGROUND OF THE INVENTION

1. Field of the Invention

The present invention relates to a piezoelectric device. More particularly, the invention concerns a piezoelectric device that in case of a piezoelectric resonator suppresses the occurrence of spurious waves and in case of a two-pole monolithic filter makes the bandwidth larger and suppresses the spurious waves.

2. Description of the Related Art

Piezoelectric devices have been being used in many communication apparatus as electronic devices each of that enables obtaining excellent frequency/temperature characteristics over a wide range of frequency from several tens of kHz to several hundreds of MHz and is small in size and also is solid.

FIGS. 5(a) and 5(b) are a plan view and a sectional view taken along a line Q—Q, which illustrate the construction of an AT cut crystal resonator. Substantially at the centers of the both surfaces of an AT cut crystal substrate 31, (hereinafter referred to as "a substrate") there are disposed mutually opposing electrodes 32a and 32b. From these electrodes 32a and 32b there are extended toward the edges of the substrate 31 lead electrodes 33a and 33b. An AT cut crystal resonator element is thereby formed. This crystal resonator element is accommodated within a package (not illustrated), and the lead electrodes 33a and 33b are connected to the terminal electrodes of the package, respectively, using electrically conductive adhesive, etc. A crystal resonator is thereby formed.

Applying a high-frequency voltage across the lead electrodes 33a and 33b of the AT cut crystal resonator illustrated in FIGS. 5(a) and 5(b), two kinds of thickness vibrations are excited. One is a thickness twist mode of vibration that propagates in the Z'-axial direction and the other is a thickness shear mode of vibration that propagates in the X-axial direction. However, in general, these two kinds of modes of vibrations are called "the thickness shear mode" of vibration, generically.

While various methods of analyses have been used as those for analyzing the thickness shear mode of oscillation, it is well known that an energy trapping theory has been widely used on account of its brevity.

Assume that various parameters of the crystal resonator be set as illustrated in FIG. 5(c). Namely, assume that H represents the thickness of the substrate; fs represents the cut-off frequency of the substrate; L represents the size of the electrode; and fe represents the cut-off frequency of the electrode part. Then, the resonance frequency fr of the crystal resonator is located between the cut-off frequencies fe and fs as illustrated in FIG. 5(d). According to the energy trapping theory, the energy trapping coefficient P is defined as in the following equation.

$$P = (\pi \sqrt{2})\, \mu L/H\sqrt{\Delta} \quad (1)$$

Also, except for the constant ($\pi\sqrt{2}$), the energy trapping coefficient P is sometimes defined as in the following equation.

$$P' = \mu L/H\sqrt{\Delta} \quad (2)$$

where $\mu$ represents the constant that is primarily determined from the elastic constants of the substrate. Accordingly, the mass loading is defined as in the following equation.

$$\Delta = (fs - fe)/fs \quad (3)$$

The energy trapping coefficient is an important parameter for determining up to which vibration mode should be set under the category of the "trapped mode".

For example, the energy trapping coefficient P' for which only a primary symmetric mode of the fundamental wave alone is set as the trapped mode is theoretically 2.17 and 2.75, respectively, for the thickness twist mode and for the thickness shear mode. However, actually, the energy trapping coefficient P' is not as theoretically. Correcting each of these values experimentally so that the amount of energy confined may become the largest, it is well known that these values should be corrected, respectively, to values of 2.4 and 2.8.

FIGS. 6(a) and 6(b) are a plan view and a sectional view taken along a line Q—Q, which illustrate a two-pole monolithic filter (hereinafter referred to as "a two-pole monolithic filter"). On one surface of a substrate 41 there are disposed electrodes 42 and 43 closely to each other, and, an electrode 44 is disposed on the other surface thereof in such a way as to oppose the electrodes 42 and 43. From the electrodes 42, 43, and 44 there are extended toward the edges of the substrate 41 lead electrodes 45, 46, and 47, thereby constructing a two-pole monolithic filter.

Applying a high-frequency voltage to the lead electrodes 45 and 47, as well known, a primary symmetrical mode of and a primary anti-symmetric mode are strongly excited in the electrodes 42, 43, and 44. Utilizing these two modes of oscillation waves, a two-pole monolithic filter is constructed.

Assume that fs represents the cut-off frequency of the substrate 41; and fe represents the cut-off frequency that prevails when having adhered the electrodes 42, 43, and 44 to the substrate 41. Then, the frequencies f1 and f2 of the excited symmetrical primary mode and primary anti-symmetric mode of oscillation waves become spectrum as illustrated in FIG. 6(c). Resultantly, the frequency bandwidth twice as large as that obtained as the difference between the frequencies f1 and f2 becomes a frequency bandwidth of the two-pole monolithic filter.

However, when attempting to design an oscillation device having a high frequency band of 200 MHz as the one for use in a crystal resonator or two-pole monolithic filter, even if using as the electrode materials an aluminum alloy that is light in mass, it is necessary to set the size of the electrodes to be very small in order to satisfy the above-described energy trapping coefficient. As a result, in case of a crystal resonator, there was the problem that the equivalent resistance was excessively high while, in case of a two-pole monolithic filter, there was the problem that the impedance was excessively high. Furthermore, at the time of the manufacture, because the electrode size is excessively small, there was also the problem that mask alignment was very difficult to make.

In order to solve these problems, an attempt has been made to use an entire-surface electrode as the electrode for use on one surface of a high-frequency crystal resonator or high-frequency two-polermonolithic filter. Through making this attempt, a device that has been arranged for mass loading not to contribute to the energy trapping has ever been put to practical use. However, when, for example, setting the electrode configuration on one side of a 200-MHz frequency-band two-pole monolithic filter of the fundamental-wave to be 0.15 mm×0.25 mm, the energy trapping coefficient becomes excessively large. As a result of this, the problem that an inharmonic mode of oscillation waves occurs still remains unsolved.

Also, FIGS. 7(a) and 7(b) are a plan view and a sectional view taken along a line Q—Q, both illustrating the construction of a monolithic crystal filter that is disclosed in Japanese Patent Application Laid-Open No. Hei10-32459. This publication describes a two-pole monolithic filter comprising a substrate 51 and electrodes 52, 53, and 54. It describes that the entire remaining portion of the substrate 51 has disposed thereon electrodes for a suppression 55b, 56a, and 56b in such a way as for these electrodes to be kept at a distance from those electrodes 52, 53, and 54 of the two-pole monolithic filter. And it describes thereby suppressing the occurrence of a higher harmonic mode of oscillation waves such as unnecessary flexible vibration, contour vibration, etc., whereby excellent pass-band characteristics have been obtained.

However, according to the width of the gap between the electrodes 52, 53, and 54 of the two-pole monolithic filter and the electrodes for a suppression 55a, 55b, 56a, and 56b disposed around these electrodes 52, 53, and 54, the respective thickness-values of the electrodes 55a, 55b, 56a, and 56b, etc., it is impossible to sufficiently confine the displacements of the two vibration modes, constituting the two-pole monolithic filter, into the region defined by the electrodes 52, 53, and 54. Resultantly, the oscillatory waves in those two vibration modes are leaked into the environmental electrodes for a suppression 55a, 55b, 56a, and 56b, with the result that there newly arises the problem that the insertion loss of the two-pole monolithic filter becomes deteriorated.

SUMMARY OF THE INVENTION

The present invention has been made in order to solve the above-described problems and has an object to provide a high-frequency piezoelectric device that, regarding a desired vibration mode of oscillation waves, enables suppressing the occurrence of an inharmonic mode of waves while keeping the energy trapping coefficient to be at a satisfactory value.

To attain the above object, according to the first aspect of the invention, there is provided a piezoelectric resonator, the piezoelectric resonator having two electrodes disposed on its piezoelectric substrate, one electrode being disposed on an obverse surface of the piezoelectric substrate and the other being disposed on a reverse surface thereof in such a way that these two electrodes are opposed to each other, wherein comb-shaped electrodes each consisting of electrode fingers and spaces are disposed around the electrode located at least on one surface of the piezoelectric substrate at prescribed space intervals between this electrode and each of the, comb-shaped electrodes.

According to the second aspect of the invention, there is provided a two-polemonolithic filter, the two-polemonolithic filter having a piezoelectric substrate that has disposed on one surface thereof a pair of electrodes close to each other and has disposed on the other surface an electrode opposed to these paired electrodes, wherein comb-shaped electrodes are disposed around the electrode located at least on one surface of the piezoelectric substrate at prescribed space intervals between this electrode and each of the comb-shaped electrodes.

According to the third aspect of the invention, there is provided a two-pole monolithic filter as described in the second aspect, wherein a comb-shaped electrode having a plurality of electrode fingers is disposed between the paired electrodes close to each other.

According to the fourth aspect of the invention, there is provided a two-polemonolithic filter, the two-polemonolithic filter having a piezoelectric substrate that has disposed on one surface thereof a pair of electrodes close to each other and has disposed on the other surface an electrode opposed to these paired electrodes, wherein an electrode having a number of holes formed therein is disposed around the paired electrodes situated at least on the one surface of the piezoelectric substrate and at prescribed space intervals between these paired electrodes and that electrode.

DESCRIPTION OF THE PREFERRED EMBODIMENTS

Figure 1:
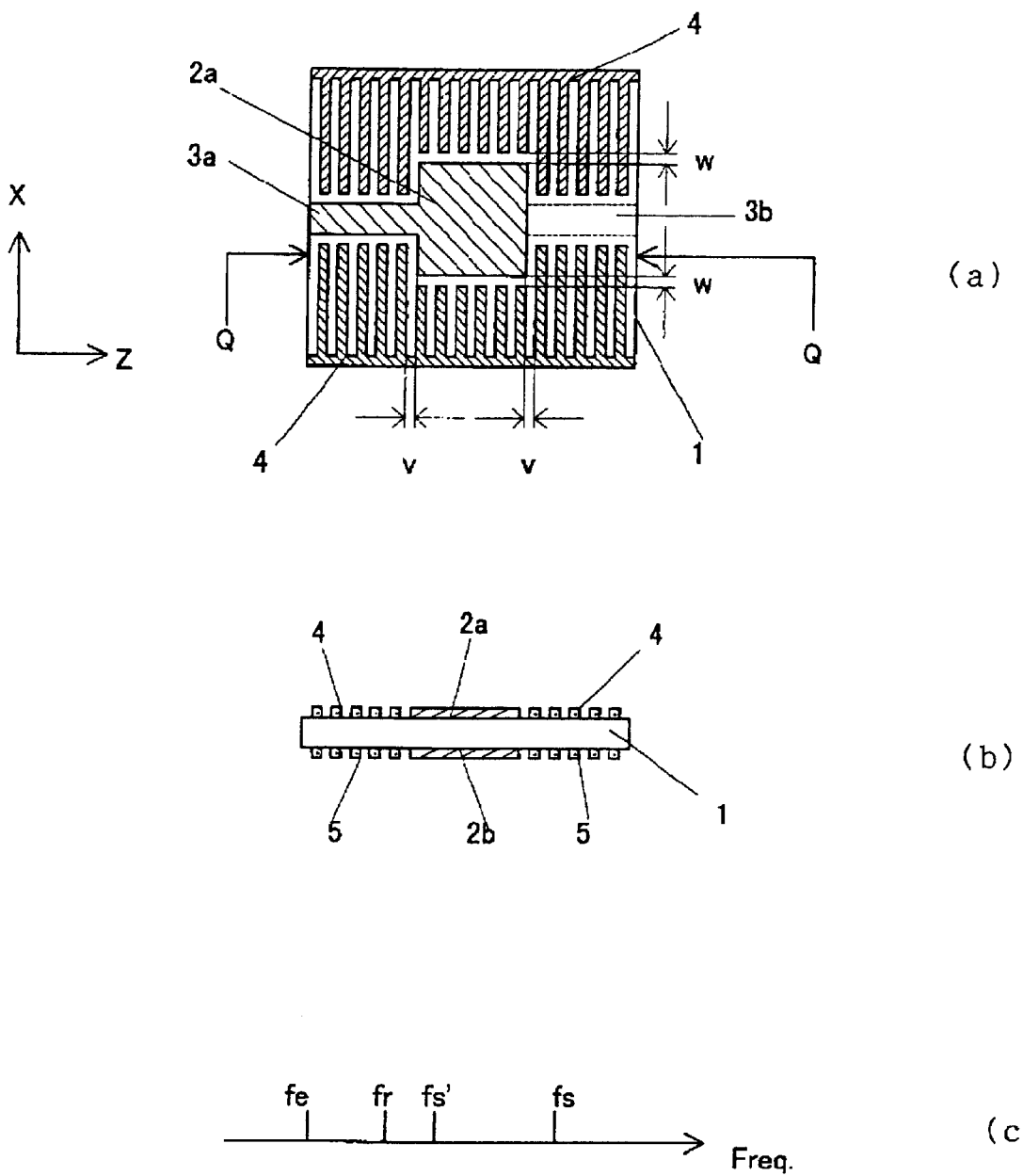
FIGS. 1(a) and 1(b) are a plan view and a sectional view, illustrating a crystal resonator according to the present invention, FIG. 1(c) illustrating the arrangement of the cut-off frequencies and the resonance frequency.

The present invention will now be explained in detail with reference to the embodiments illustrated in the drawings.

FIG. 1 is a plan view illustrating the construction of a high-frequency crystal resonator according to the invention. At substantially central parts of a substrate 1 there are disposed mutually opposing electrodes 2a and 2b, respectively. From the electrodes 2a and 2b there are extended toward the edges of the substrate 1 lead electrodes 3a and 3b, respectively. Comb-shaped electrodes 4 and 5 are disposed, respectively, up to the edges of the substrate 1, in such a way that the comb-shaped electrodes 4 and 5 are spaced, at distances of v and v in the positive/negative directions of a Z axis (of the coordinate axes illustrated at a left/lower corner of the FIG. 1(a)), and, at distances of w and w in the positive/negative direction of an X axis thereof, from the electrodes 2a and 2b, respectively. The respective edges of the comb-shaped electrodes 4 and 5 are each short-circuited so as not to cause the excitation of Surface Acoustic Wave.

The characterizing feature of the present invention resides in that the electrodes 2a and 2b are surrounded, respectively, by the comb-shaped electrodes 4 and 5, with each electrode 4, 5 being spaced at the distances of v and w from its corresponding electrode 2a, 2b. By disposing such comb-shaped electrodes 4 and 5, the following relationship holds true. Namely, three cut-off frequencies, which are the cut-off frequency fs of the substrate 1, the cut-off frequency fe of the electrode 2a, 2b portions, and the cut-off frequency fs' of the comb-shaped electrodes 4, 5 portions, and the resonance frequency fr of the crystal resonator, exist. These frequencies are spectrum in the sequential order illustrated in FIG. 1(c).

The rate of decrease in frequency of the electrode 2a, 2b portions as taken with respect to the substrate 1 portion is previously defined as in the equation (3). However, the rate of decrease in frequency of the electrode 2a, 2b portions as taken with respect to the comb-shaped electrode 4, 5 portions is expressed as $\Delta'=(fs'-fe)/fs'$. Accordingly, in the crystal resonator wherein as illustrated in FIG. 1(a) the comb-shaped electrodes 4, 5 are disposed around the electrodes 2a, 2b, the rate $\Delta'$ of decrease in frequency becomes small compared to the rate $\Delta$ of decrease in frequency $\Delta=(fs-fe)/fs$ of the conventional crystal resonator having no comb-shaped electrodes 4, 5 disposed therein. Therefore, it becomes possible to make the energy trapping coefficient P' small. Resultantly, a higher order of vibration mode than a desired order of vibration mode does not become a confined order of vibration mode. In addition, because it is possible to make the energy trapping coefficient P' small, there occurs a room for either making the size of the electrode large or making the thickness of the electrode great.

Also, when spreading the electrode 2b to over the entire substrate in place of the comb-shaped electrode 5 on the reverse surface thereof, it is possible to make the energy trapping coefficient further small. Such a crystal resonator can advantageously be applied to a so-called "ultra-thin plate crystal resonator", the substrate of that has a recessed portion provided substantially at its central part.

By the way, it is possible to make variable the displacement distribution of the vibration mode by controlling the width of the gap v, w between the electrode 2a, 2b and the comb-shaped electrode 4, 5. For example, when setting the widths of the v and w gaps to be at larger values, the hem of the: displacement distribution is located at the central part. And, when setting each of those widths to be at a small value, this hem is spread up to the peripheral part. This effect is the same as that which would be attainable when changing the energy trapping coefficient.

Also, by changing the ratio of line-and-space (the ratio of the width of the electrode fingers and the width of the spaces) of the comb-shaped electrodes 4, 5, it is possible to change the rate of decrease in frequency $\Delta'=(fs'-fe)/fs'$ and thereby control the energy trapping coefficient. It is only needed to suitably select the percentage of line occupation of the comb-shaped electrodes according to the frequency band used.

Also, by differentiating the thickness of the electrode 2a, 2b and the comb-shaped electrode 4, 5 from each other, it becomes possible to minutely adjust the effect of the energy trapping.

FIGS. 2(a), 2(b), and 2(c) are a plan view, a reverse surface view, and a sectional view taken along a line Q—Q, illustrating the construction of a high-frequency two-pole monolithic filter according to a second embodiment of the present invention. Substantially at a central part of one surface of the substrate 1 there are disposed closely to each other electrodes 10 and 11. On the other surface thereof there is provided an entire-surface electrode 12. From the electrodes 10 and 11 there are extended toward the edges of the substrate 1 lead electrodes 13 and 14, respectively. Further, comb-shaped electrodes 15, 15 are disposed, respectively, up to the edges of the substrate 1, in such away that the comb-shaped electrodes 15, 15 are spaced, at distances of v and v in the positive/negative directions of a Z axis (the coordinate axes illustrated at a left/lower corner of the FIG. 2(a)), and, at distances of w and w in the positive/negative direction of an X axis thereof, from the electrodes 15, 15, respectively. The respective edges of the comb-shaped electrodes 15, 15 are each short-circuited.

Figure 2:
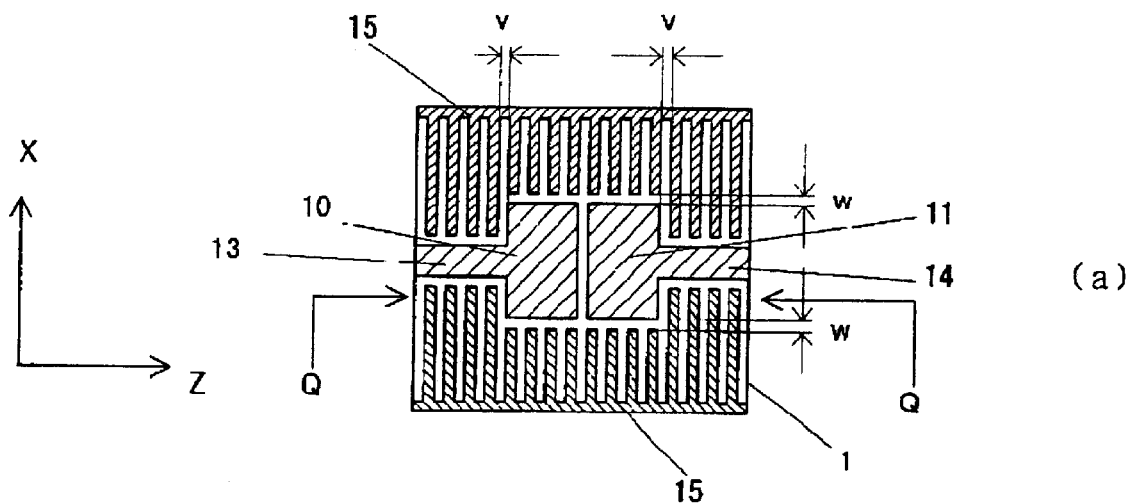
FIGS. 2(a), 2(b), and 2(c) are a plan view, a bottom view, and a sectional view, illustrating a two-pole monolithic filter according to a second embodiment of the present invention, FIG. 2(d) illustrating the arrangement of the cut-off, frequencies and the resonance frequency.
Figure 2:
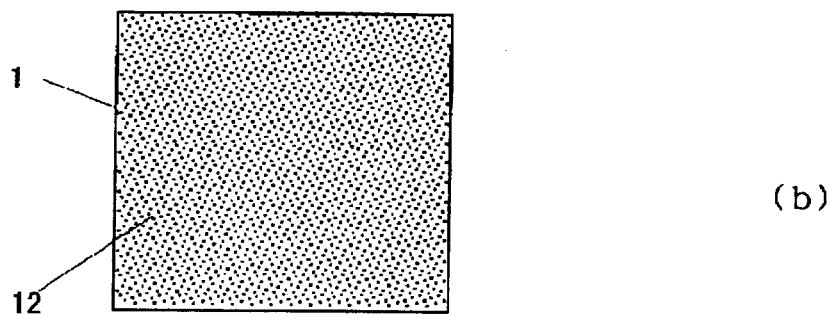
Figure 2:
Figure 2:
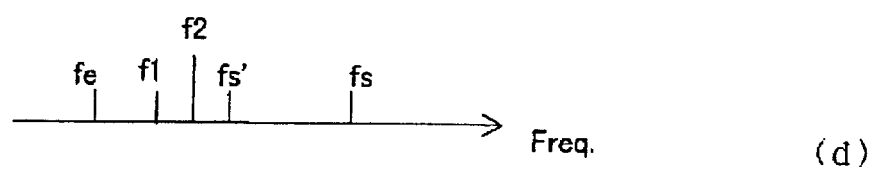

As in the case of the crystal resonator of FIG. 1, the cut-off frequencies of the two-pole monolithic filter illustrated in FIG. 2 are the cut-off frequency fs of a combination of the substrate 1 and the reverse-surface electrode 12, the cut-off frequency fe of the electrode 10, 11 part, and the cut-off frequency fs' of the comb-shaped electrode 15 part. Assume that f1 and f2 represent a symmetrical primary mode of frequency and an primary anti-symmetric mode of frequency, respectively, which are excited on the electrodes 10 and 11. Then, those cut-off frequencies and these frequencies are spectrum in the sequential order illustrated in FIG. 2(d).

The rate $\Delta'$ of decrease in frequency of the two-pole monolithic filter illustrated in FIG. 2(a) becomes $\Delta'=(fs'-fe)$ fs'. Resultantly, it becomes possible to make the energy trapping coefficient small compared to the rate $\Delta$ of decrease in frequency $\Delta=(fs-fe)/fs$ of the two-pole monolithic filter having no comb-shaped electrodes provided on the substrate 1. As a result of this, it is possible to suppress the occurrence of spurious waves due to an inharmonic mode of waves.

The reverse-surface electrode of FIG. 2(b) has been taken up as an example of the entire-surface electrode. However, there is also a method wherein as in the case of the obverse-surface electrode comb-shaped electrodes are disposed around a partial or separate electrode, etc. Suitably using such a method, etc. according to the center frequency is effective.

Also, it is possible to control the energy trapping coefficient through using the gaps v and w between the electrode 10, 11 and the comb-shaped electrode 15, the percentage of line occupation of the comb-shaped electrodes, or the thickness of the comb-shaped electrode 15 as in the case of FIG. 1. Thereby, it is possible to suppress the occurrence of unnecessary spurious waves.

FIGS. 3(a) and 3(b) illustrate a third embodiment of the present invention and are respectively a plan view and a sectional view, illustrating the construction of a high-frequency two-pole monolithic filter. On a flat-part side of the thin plate substrate 1, one surface of that has provided a recess at its central part, there are disposed electrodes 21, 22 in such a way that these electrodes are opposed to each other with a gap g in between. From the electrodes 21, 22 there are extended toward the edges of the substrate 1 lead electrodes 24, 25.

And, a comb-shaped electrode 26 is disposed over the entire surface of the substrate 1 excepting that, as illustrated in FIG. 3(a), the comb-shaped electrode 26 is spaced, at distances of v and v as taken in the Z-axial directions, from the portions on the substrate 1 edgesides of the electrodes 21, 22, and is also spaced, at distances of w and w taken in the X-axial directions, from the portions on the substrate 1 edgesides of the electrodes 21, 22.

Further, by adhering the entire electrode 23 to the surface on the recessed-portion side of the substrate 1, this surface ceases to make a contribution to the energy trapping effect due to its electrode 23.

The characterizing feature of the present; invention resides in that the comb-shaped electrode is disposed at the gap g between the electrodes 21 and 22 as well.

In case that making wider the bandwidth of. the two-pole monolithic filter, it is general to set the gap g between the. electrodes 21 and 22 to be narrow. However, when; making wider the bandwidth up to a high frequency of 200 MHz, the configuration of the electrode 21 becomes as very small as 0.15 mm×0.25 mm. The gap g between the electrodes also becomes as very narrow as from 0.01 mm to 0.02 mm. In such a case, even when attempting to apply a deposit in order to adjust the electrodes 21, 22 in terms of the frequency, mask alignment becomes very difficult to perform and in addition the short-circuiting between the electrodes also become easy to occur.

In view of the above, the inventor of this application has disposed the comb-shaped electrode 26 in the gap g portion between the electrodes. By doing so, he has more decreased the cut-off frequency fs' of the gap g portion than the cut-off frequency fs that prevails when no comb-shaped electrode is disposed there. As a result, he has discovered that it is possible to make strong the acoustic coupling between the electrodes 21 and 22 by doing like that. For example, when setting the gap g between the electrodes to be 0.05 mm and the width of the electrode finger of the comb-shaped electrode to be 2 $\mu$m, it results that twelve electrode fingers or so can be disposed in the gap g portion.

By changing the percentage of line occupation of the comb-shaped electrode 26, it is possible to minutely control the cut-off frequency fs' of the comb-shaped electrode 26 part. As a result of this, it is possible to highly precisely control the acoustical coupling between the electrodes 21 and 22, i.e., the width of the pass-band. Also, that it is possible to control the energy trapping coefficient through the use of the percentage of line occupation is as stated previously.

Also, by the intra-electrode gap g being made wider, mask alignment becomes easy to perform when adjusting the frequency of the electrodes 21, 22.

Figure 3:
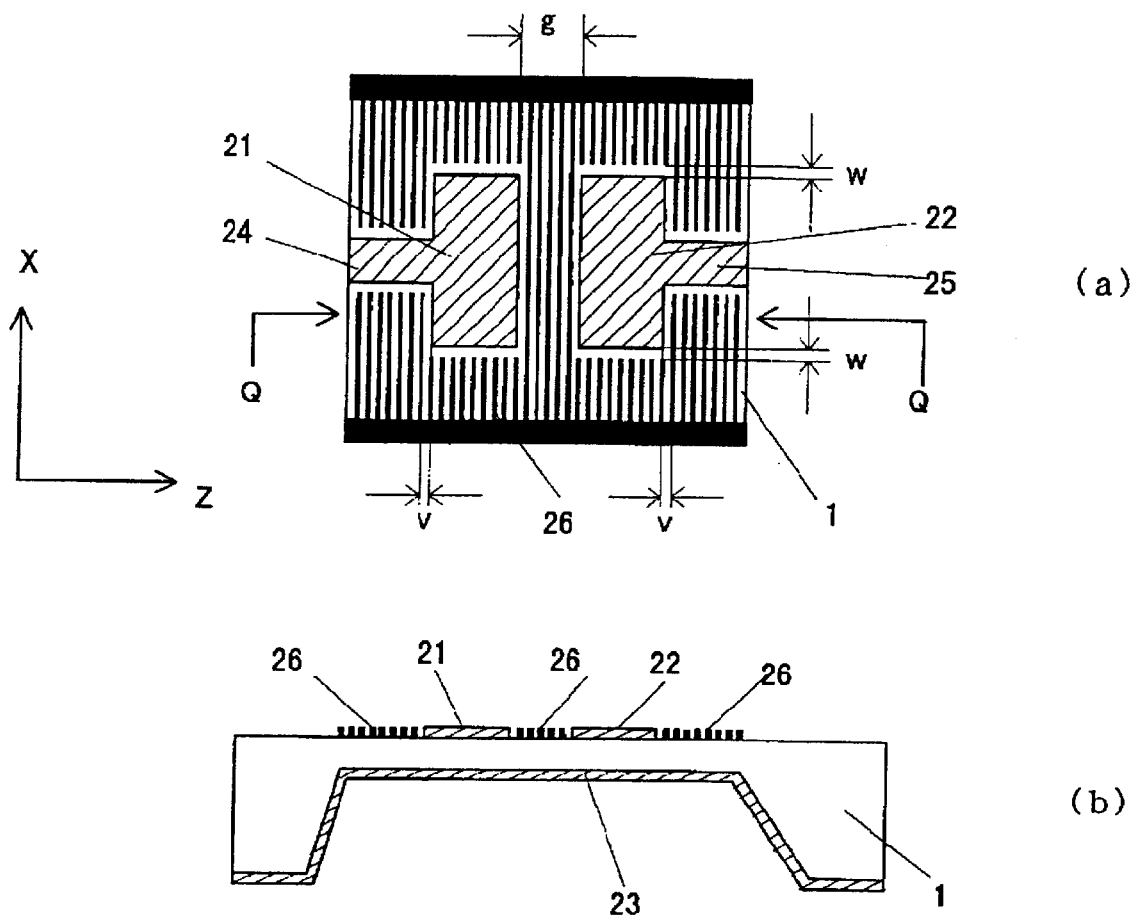
FIGS. 3(a) and 3(b) are a plan view and a sectional view, illustrating a two-pole monolithic filter according to a third embodiment of the present invention.

FIGS. 4(a) and 4(b) illustrate a fourth embodiment of the present invention. The difference of it from the embodiments illustrated in FIGS. 1 through 3 is that a number of a given shape, such as a circular shape, of holes are formed in the electrode 26' disposed so as to surround the electrodes 21 and 22, by etching, laser, etc. And it is arranged that the cut-off frequency of the electrode 26' is thereby made higher. In each of the embodiments illustrated in FIGS. 1 through 3, because the comb-shaped electrodes are disposed around the principal electrodes, the concavities and convexities are large in number in the Z directions in the figure. In contrast to this, the variations, which occur in the X directions, are small in number. Therefore, between in the X directions and in the Z directions, the propagation of the vibration displacement is different in terms of the way. Therefore, there is the possibility of spurious waves being excited. In order to eliminate this possibility, it is necessary to find out an optimum configuration of electrode through repeated trial manufactures and simulations. Therefore, the crystal resonator becomes complex to design.

Figure 4:
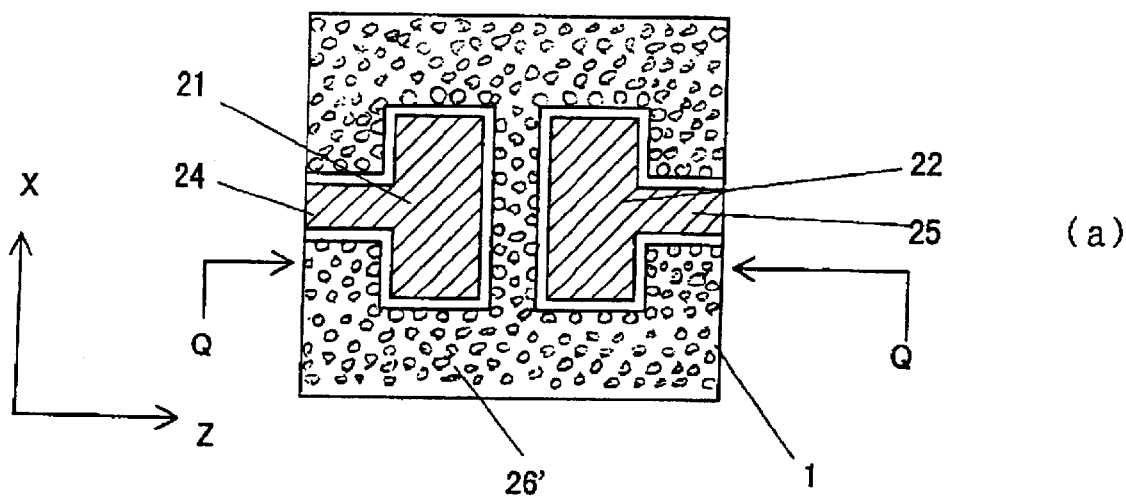
FIGS. 4(a) and 4(b) are a plan view and a sectional view, illustrating a two-pole monolithic filter according to a fourth embodiment of the present invention.
Figure 4:
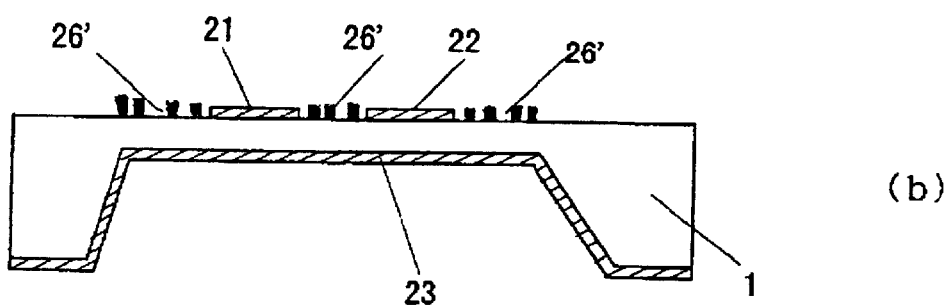
Figure 5:
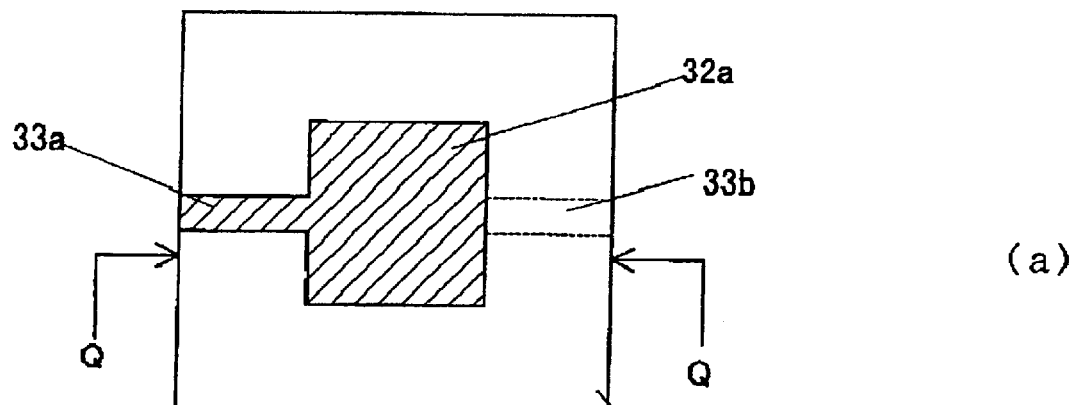
FIGS. 5(a) and 5(b) are a plan view and a sectional view, illustrating a conventional crystal resonator, FIG. 5(c) being a view illustrating various parameters, and FIG. 5(d) illustrating the arrangement of the cut-off frequencies and the resonance frequency.
Figure 5:
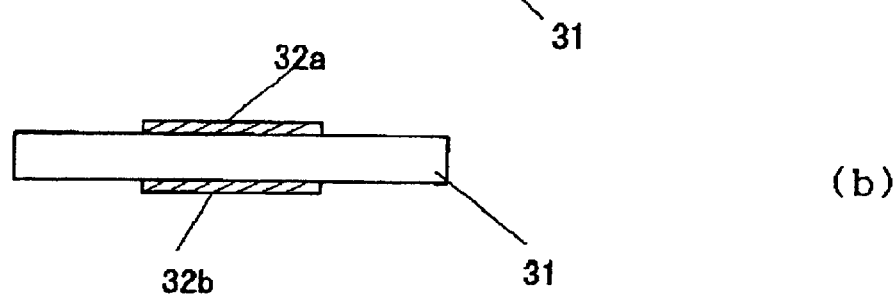
Figure 5:
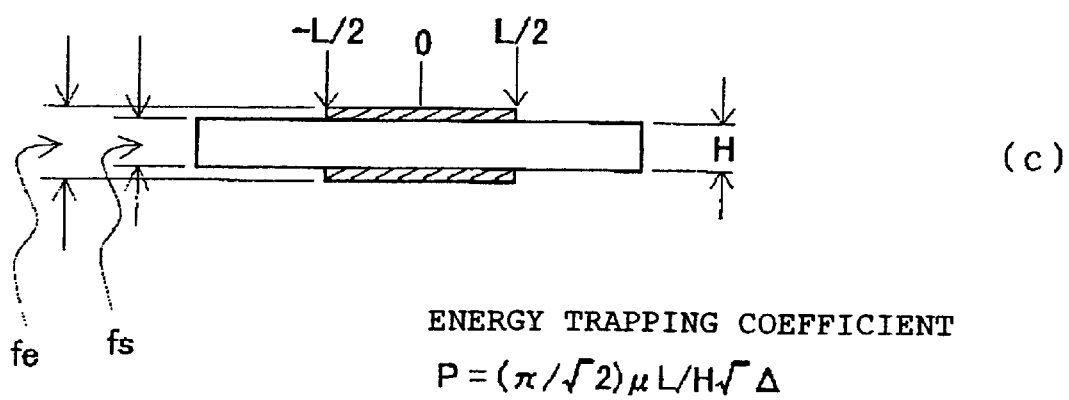
Figure 5:
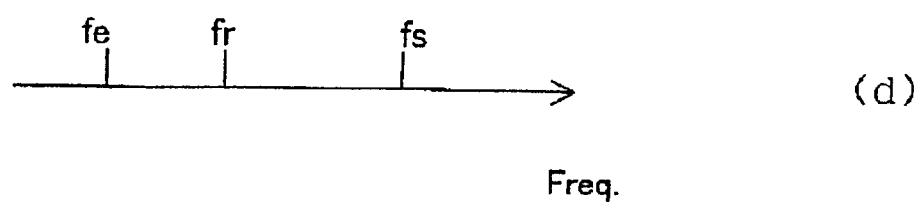
Figure 6:
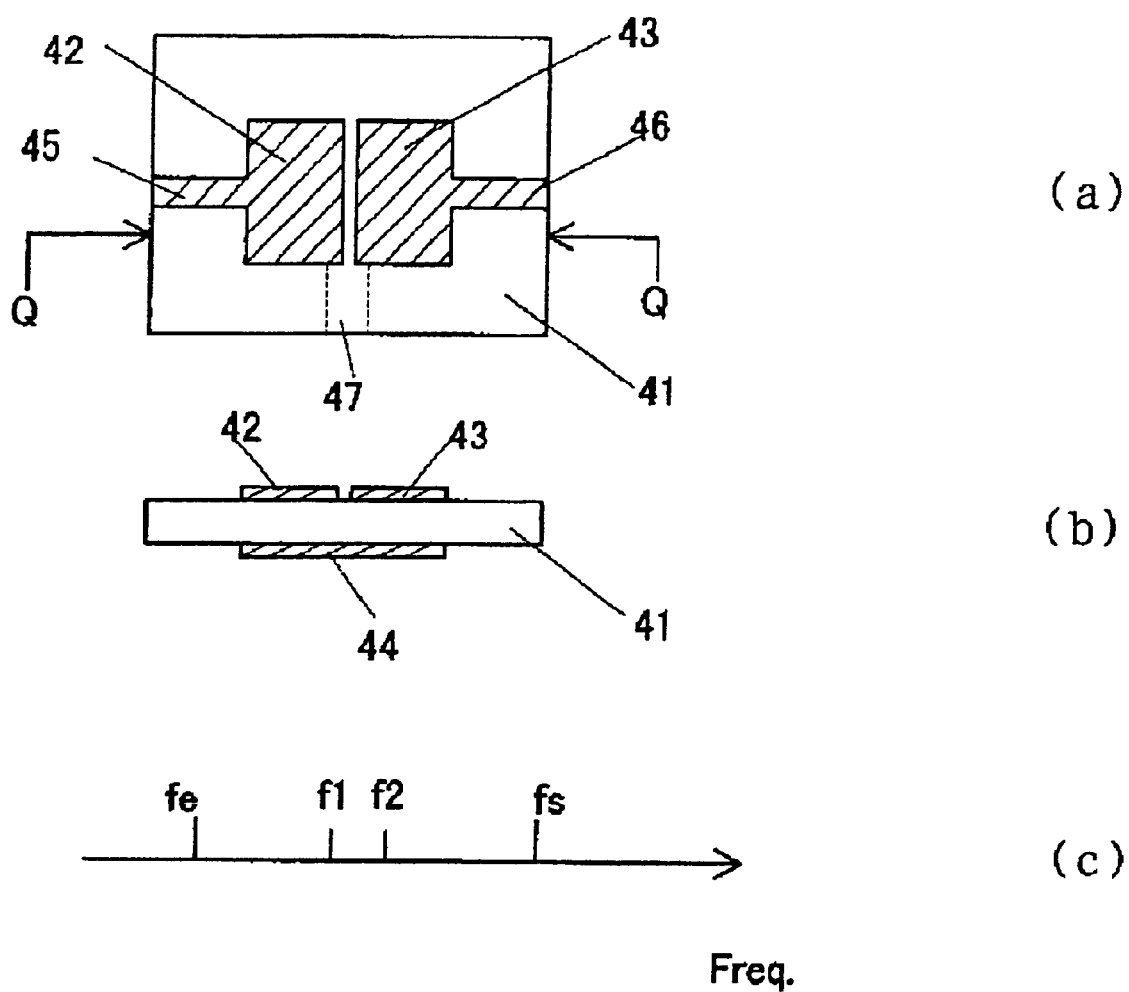
FIGS. 6(a) and 6(b) are a plan view and a sectional view, illustrating a conventional two-pole monolithic filter, FIG. 6(c) illustrating the arrangement of the cut-off frequencies an the resonance frequency.
Figure 7:
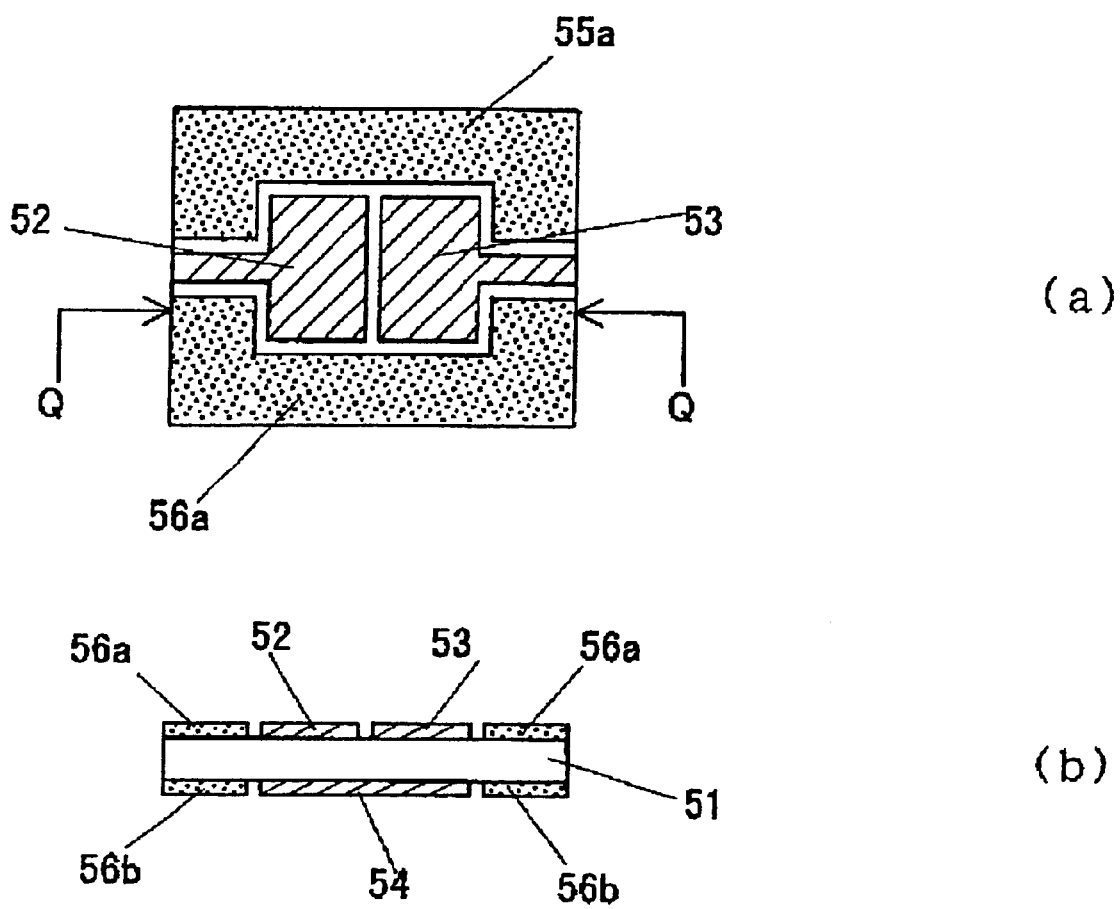
FIGS. 7(a) and 7(b) are a plan view and a sectional view, illustrating a conventional two-pole monolithic filter.

On this account, this embodiment has formed the electrode 26' having a large number of holes as illustrated in FIG. 4 so that the oscillation displacement does not depend upon the X-axial and Z-axial directions. By doing so, the effect that is equivalent to that of suppressing the occurrence of spurious waves which is attainable with the comb-shaped electrode 26 illustrated in FIG. 3 is obtained. In addition, the dependence upon the X-axial and Z-axial directions also is simultaneously obviated. It is to be noted that the cut-off frequency of the electrode 26' depends upon the ratio between the area of the electrode 26' and a sum total of the areas of all holes that have been formed.

As has been described above, the piezoelectric substrate has been explained using a crystal AT cut substrate. However, the invention is not limited to a crystal substrate. The invention can needless to say be also applied to the thickness shear resonator, thickness longitudinal resonator, etc. that uses a substrate based on the use of langasite, lithium tantalate, lithium niobate, or lithium tetraborate.

Since having been constructed as described above, the invention according to the first aspect can suppress the occurrence of spurious waves near the resonance frequency of the piezoelectric resonator by aptly setting the cut-off frequency of the piezoelectric substrate, the cut-off frequency in the region of electrode, and the cut-off frequency in the neighborhood of the electrodes.

The invention according to the second aspect can suppress the occurrence of spurious waves near the pass-band of the two-polemonolithic filter by aptly setting the cut-off frequency of the piezoelectric substrate, the cut-off frequency in the region of electrode, and the cut-off frequency in the neighborhood of the electrodes.

The invention according to the third aspect has disposed the comb-shaped electrode between the two electrodes disposed on one surface of the substrate thereof. Therefore, the invention suppresses the occurrence of spurious waves in the neighborhood of the pass-band and, because the intra-electrode gap becomes wide, facilitates mask alignment for purpose of minute adjustment.

The invention according to the fourth aspect lessens the effect of the array direction of the electrode fingrs upon the oscillation displacement, which would prevail in, the first to third aspect of the invention. Therefore, the occurrences of spurious waves in the axial directions become equalized to facilitate the suppression thereof.

What is claimed is:

1. A piezoelectric resonator, the piezoelectric resonator having electrodes disposed on its piezoelectric substrate, one electrode being disposed on an obverse surface of the piezoelectric substrate and an other being disposed on a reverse surface thereof in such a way that these two electrodes are opposed to each other, comprising:

comb-shaped electrodes each consisting of electrode fingers and spaces, the comb-shaped electrodes being disposed around the electrode situated at least on one surface of the piezoelectric substrate at prescribed space intervals between this electrode and the comb-shaped electrode and wherein said comb-shaped electrodes are short-circuited so as not to cause excitation of a surface acoustic wave and an unwanted response.

2. A two-pole monolithic filter, the two-pole monolithic filter having a piezoelectric substrate that has disposed on one surface thereof a pair of electrodes close to each other and has disposed on the other surface an electrode opposed to these paired electrodes, comprising:

the comb-shaped electrodes that are disposed around the electrodes situated at least on the one surface of the piezoelectric substrate at prescribed space intervals between these electrodes and the comb-shaped electrode and wherein said comb-shaped electrodes are short-circuited so as not to cause excitation of a surface acoustic wave and an unwanted response.

3. The two-pole monolithic filter according to claim 2, wherein said comb-shaped electrode has a plurality of electrode fingers disposed between the paired electrodes close to each other.

4. A two-pole monolithic filter, the two-pole monolithic filter having a piezoelectric substrate that has disposed on one surface thereof a pair of electrodes close to each other and has disposed on the other surface an electrode opposed to these paired electrodes, comprising:

an electrode having a number of holes is disposed around the paired electrodes situated at least on the one surface of the piezoelectric substrate and at prescribed space intervals between these paired electrodes and that electrode and wherein said electrodes having a number of holes are short-circuited so as not to cause excitation of an unwanted response.

5. A piezoelectric resonator including electrodes disposed on a thin-skin oscillating part of a piezoelectric substrate and wherein comb-shaped electrodes consisting of electrode fingers and spaces at prescribed space intervals are disposed around said electrodes, the electrodes are disposed on said thin-skin oscillating part of the piezoelectric substrate having a recessed or reverse recessed cross-sectional structure or a reverse recessed type in such a way that these electrodes are opposed to each other, the thin-skin oscillating part and a thick-skin circular surrounding part that supports a perimeter of the oscillating part are constructed in a unified form and said comb-shed electrodes are short-circuited so as not to cause excitation of a surface acoustic wave and an unwanted response.

6. A dual-mode piezoelectric filter including paired electrodes disposed on a thin-skin oscillating part of a piezoelectric substrate and wherein comb-shaped electrodes consisting of electrode fingers and spaces at prescribed space intervals are disposed on a perimeter of the paired electrodes located close to each other and the paired electrodes are disposed on an oscillating part on a flat side of the piezoelectric substrate having a recessed or reverse recessed cross-sectional structure and the paired electrodes are located on a main surface on the flat side and an entire electrode is located on a recessed-portion side, the thin-skin oscillating part and a thick-skin circular surrounding part that supports a perimeter of said oscillating part are constructed in a unified form and said comb-shaped electrodes are short-circuited so as not to cause excitation of a surface acoustic wave and an unwanted response.

7. The two-pole monolithic filter according to claim 6 wherein said comb-shaped electrodes are disposed between the paired electrodes.

8. A two-pole monolithic filter including paired electrodes disposed on a thin-skin oscillating part of a piezoelectic substrate, wherein electrodes having a number of holes disposed at prescribed spaced intervals in said electrodes surround the paired electrodes located close to each other and the paired electrodes are disposed on an oscillating part on a flat side of the piezoelectric substrate having a recessed or reverse recessed cross-sectional structure and the paired electrodes are located on a main surface of the flat side and an entire electrode is located on a recessed-portion side, the thin-skin oscillating part and a thick-skin circular surrounding part that supports a perimeter of the oscillating part are constructed in a unified form and said electrodes with holes are short-circuited so as not to cause excitation of an unwanted response.

* * * * *